United States Patent
Wang et al.

(10) Patent No.: US 11,043,578 B2
(45) Date of Patent: Jun. 22, 2021

(54) NANOWIRE STACK GAA DEVICE WITH INNER SPACER

(71) Applicant: Taiwan Semiconductor Manufacturing Co., Ltd., Hsinchu (TW)

(72) Inventors: Tzu-Chung Wang, Hsinchu (TW); Chao-Ching Cheng, Hsinchu (TW); Tzu-Chiang Chen, Hsinchu (TW); Tung Ying Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/118,143

(22) Filed: Aug. 30, 2018

(65) Prior Publication Data

US 2020/0075716 A1 Mar. 5, 2020

(51) Int. Cl.
*H01L 29/76* (2006.01)
*H01L 29/66* (2006.01)
(Continued)

(52) U.S. Cl.
CPC .. *H01L 29/66795* (2013.01); *H01L 21/02532* (2013.01); *H01L 21/02603* (2013.01); *H01L 21/823431* (2013.01); *H01L 21/823807* (2013.01); *H01L 21/823814* (2013.01); *H01L 21/823864* (2013.01); *H01L 21/823878* (2013.01); *H01L 29/0673* (2013.01); *H01L 29/0847* (2013.01); *H01L 29/1033* (2013.01); *H01L 29/42356* (2013.01); *H01L 29/6681* (2013.01); *H01L 29/66439* (2013.01);
(Continued)

(58) Field of Classification Search
CPC ............. H01L 29/0673; H01L 29/1033; H01L 29/0847; H01L 29/785; H01L 29/66553; H01L 29/6681; H01L 29/42356; H01L 29/775; H01L 29/66439; H01L 29/66545; H01L 2029/7858; H01L 29/78618; H01L 29/78654; H01L 29/78684; H01L 29/66772; H01L 29/66742; H01L 29/42392; H01L 29/78696; H01L 29/78; H01L 29/0669; H01L 29/66795; H01L 21/02603
See application file for complete search history.

(56) References Cited

U.S. PATENT DOCUMENTS 9,236,267 B2   1/2016   De et al.
9,502,265 B1   11/2016  Jiang et al.
(Continued)

*Primary Examiner* — Shouxiang Hu
(74) *Attorney, Agent, or Firm* — Slater Matsil, LLP

(57) ABSTRACT

The current disclosure describes techniques for forming a low resistance junction between a source/drain region and a nanowire channel region in a gate-all-around FET device. A semiconductor structure includes a substrate, multiple separate semiconductor nanowire strips vertically stacked over the substrate, a semiconductor epitaxy region adjacent to and laterally contacting each of the multiple separate semiconductor nanowire strips, a gate structure at least partially over the multiple separate semiconductor nanowire strips, and a dielectric structure laterally positioned between the semiconductor epitaxy region and the gate structure. The first dielectric structure has a hat-shaped profile.

19 Claims, 13 Drawing Sheets

(51) Int. Cl.
  *H01L 29/06* (2006.01)
  *H01L 29/10* (2006.01)
  *H01L 29/08* (2006.01)
  *H01L 29/78* (2006.01)
  *H01L 29/423* (2006.01)
  *H01L 29/775* (2006.01)
  *H01L 21/8238* (2006.01)
  *H01L 21/02* (2006.01)
  *H01L 21/8234* (2006.01)

(52) U.S. Cl.
  CPC .. *H01L 29/66545* (2013.01); *H01L 29/66553* (2013.01); *H01L 29/775* (2013.01); *H01L 29/785* (2013.01); *H01L 2029/7858* (2013.01)

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,741,811 B2 * | 8/2017 | Hatcher .............. H01L 29/0673 |
| 9,786,774 B2 | 10/2017 | Colinge et al. |
| 9,853,101 B2 | 12/2017 | Peng et al. |
| 9,881,993 B2 | 1/2018 | Ching et al. |
| 10,243,061 B1 | 3/2019 | Cheng et al. |
| 10,396,177 B2 * | 8/2019 | Yamashita .......... H01L 29/6659 |
| 10,535,733 B2 | 1/2020 | Cheng et al. |
| 10,679,906 B2 | 6/2020 | Cheng et al. |
| 2014/0001441 A1 | 1/2014 | Kim et al. |
| 2015/0380313 A1 | 12/2015 | Ching et al. |
| 2017/0162453 A1 * | 6/2017 | Pillarisetty .......... H01L 29/0673 |
| 2017/0194215 A1 * | 7/2017 | Ching ............. H01L 21/823821 |
| 2017/0213888 A1 | 7/2017 | Chang et al. |
| 2019/0157444 A1 * | 5/2019 | Yang ................... H01L 29/6681 |
| 2019/0189739 A1 | 6/2019 | Li et al. |

\* cited by examiner

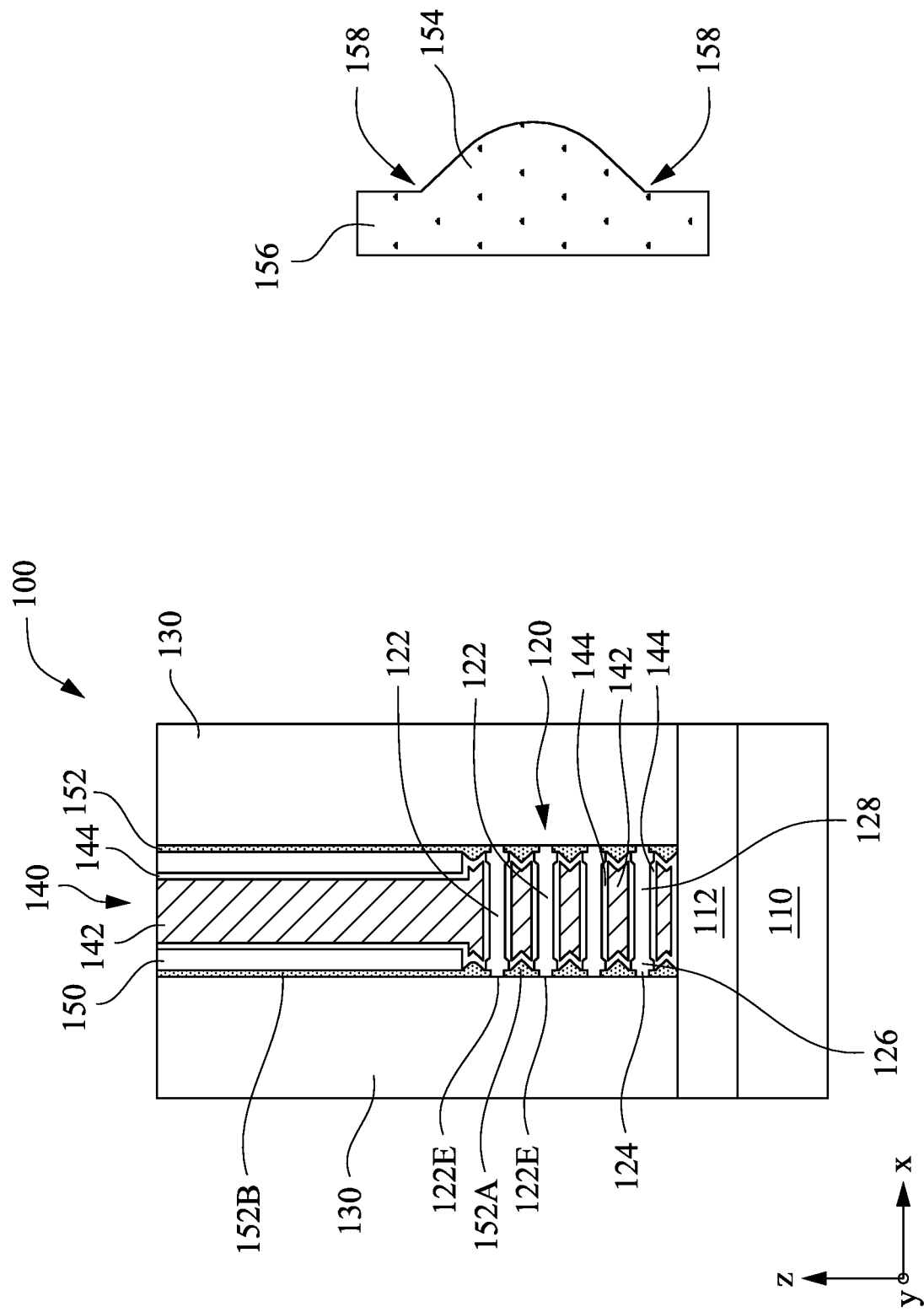

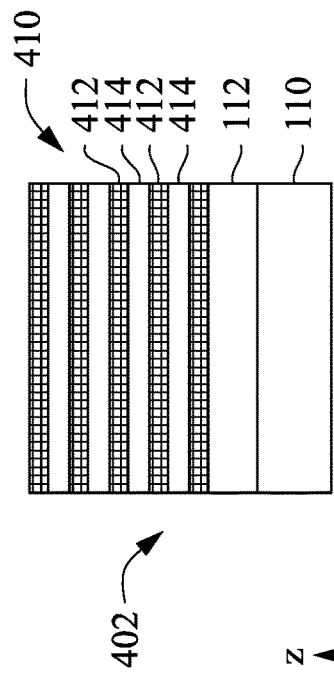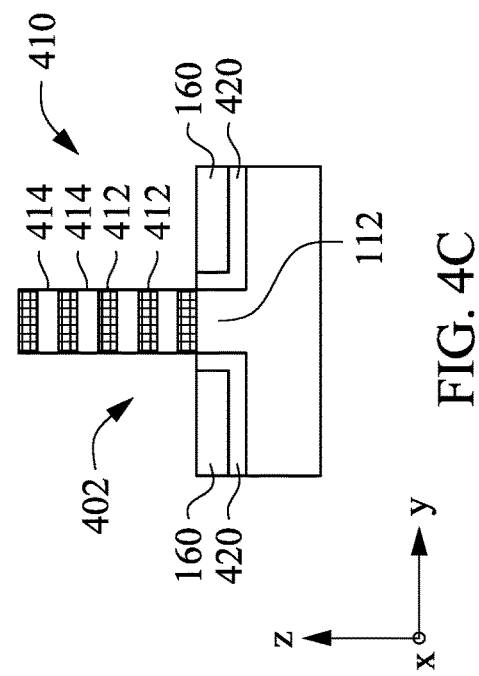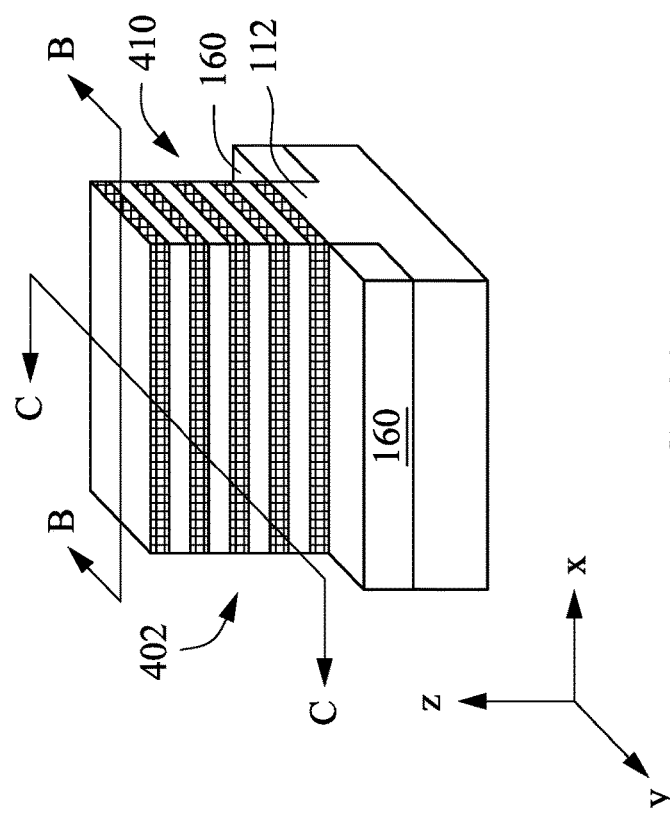
FIG. 4B
FIG. 4C
FIG. 4A

NANOWIRE STACK GAA DEVICE WITH INNER SPACER

BACKGROUND

Complementary metal oxide semiconductor (CMOS) transistors are building blocks for integrated circuits. Faster CMOS switching speed requires higher drive current, which drives the gate lengths of CMOS transistors down. Shorter gate lengths lead to undesirable "short-channel effects," in which the current control functions of the gates are compromised. FinFET transistors have been developed to, among other things, overcome the short-channel effects. As a further step toward improving electrostatic control of the channels, transistors having wrapped-around gates have been developed, in which a gate portion may surround a semiconductor channel or channel strip from the upper surface and sidewalls thereof.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 1A-1C are perspective views and cross-sectional views of an example device according to example embodiments of the disclosure;

FIGS. 1D-1E are cross-sectional views of embodiments of an inner spacer of the example device of FIGS. 1A-1C;

FIGS. 3A-12 are prospective views and cross-sectional views of various stages of making the example device of FIGS. 1A-1C according to example embodiments of the disclosure.

DETAILED DESCRIPTION

Figure 1A:
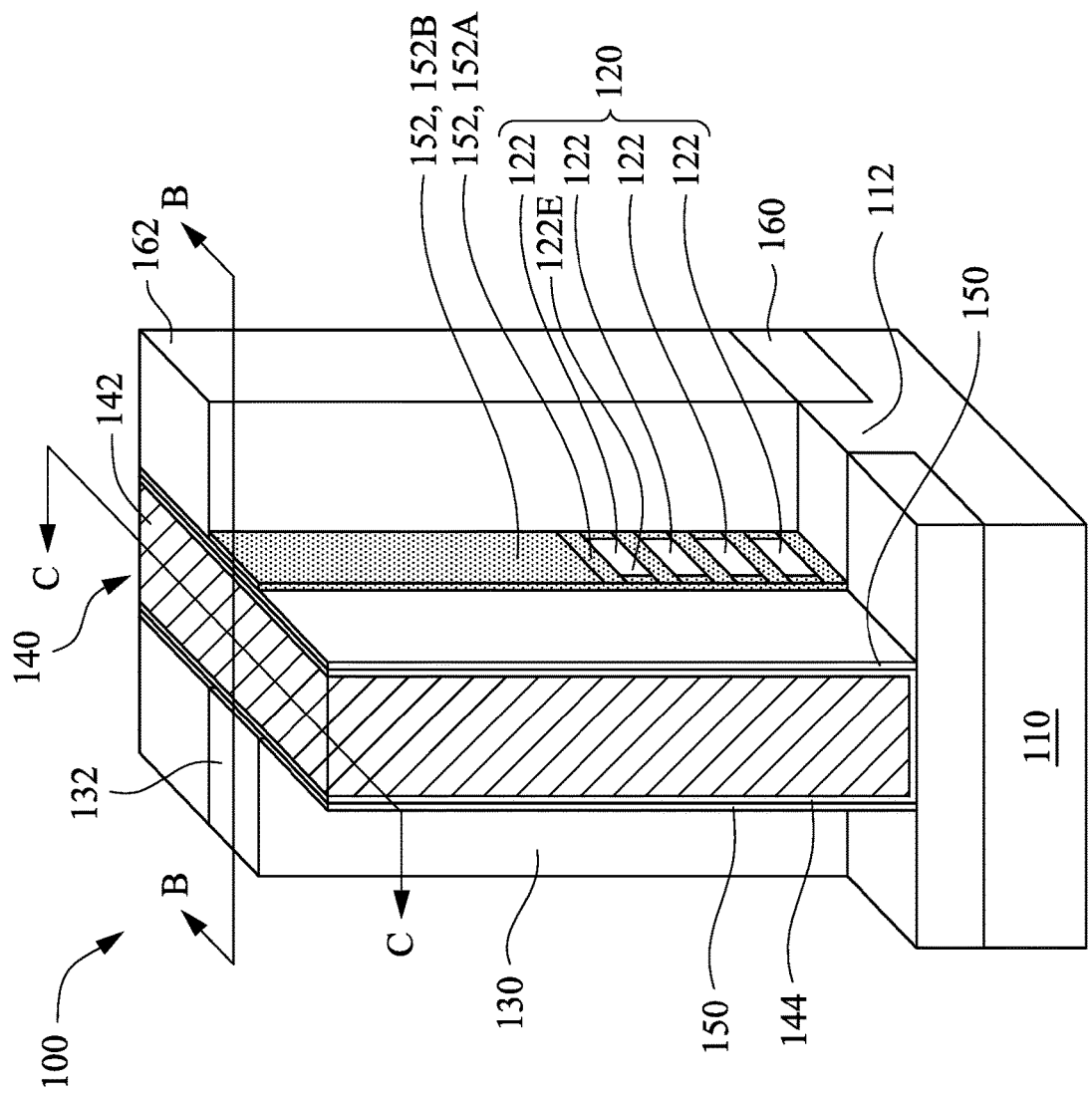

The current disclosure describes techniques for a low resistance junction between a source/drain region and a nanowire channel region in a gate-all-around FET device. A stack of nanowire strips are formed including silicon nanowire strips and silicon germanium nanowire strips stacked alternatively. A dummy gate structure is formed over and surrounding the stack of nanowire strips. The silicon germanium (or the silicon) nanowire strips are used as sacrificial strips and the silicon (or silicon germanium) nanowire strips are used as the semiconductor body or channel of the FET device, and is referred to as "semiconductor nanowire strips." The sacrificial strips are selectively receded with the semiconductor nanowire strips remaining. Inner spacers are formed laterally adjacent to the receded sacrificial strips. The semiconductor nanowire strips are receded simultaneously with or after the inner spacers are formed such that it is ensured that edge surfaces of the receded semiconductor nanowire strips are exposed from the inner spacers. Source/drain regions are formed through epitaxy procedures, contact each of the exposed edge surfaces of the receded semiconductor nanowire strips. Ohmic junctions between the source/drain region and the channel region (i.e., the receded semiconductor nanowire strips) are ensured because the edge surfaces of the receded semiconductor nanowire strips are not covered by the dielectric material of the inner spacer.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1A is a perspective view of a device 100. Referring to FIG. 1A, the device 100 includes a substrate 110 that includes a lower fin structure 112. A stack 120 of discrete nanowire structures 122 ("nanowire stack 120") are formed over the substrate 110 and more specifically, in an embodiment, over the lower fin structure 112 of the substrate 110. The nanowire stack 120 includes multiple nanowire structures 122, e.g., nanowire strips, that are stacked vertically, in the z direction, over one another. Two source/drain structures 130 are formed adjacent to and contacting at least some of the nanowire structures 122 by edge surfaces 122E of the contacted nanowire structures 122. Note that in FIG. 1A, one of the source/drain structure 130 is omitted to show the nanowire stack 120, for illustrative purposes. It should be appreciated that in the final device 100, the nanowire stack 120 is not exposed.

A gate structure 140 is formed over the substrate 110. The gate structure 140 includes a gate electrode 142 and a gate dielectric layer 144. The gate structure 140 is separated from the source/drain structure 130 by at least one of an outer spacer structure 150 and an inner spacer structure 152. Specifically, for example, the inner spacer structure 152 is formed laterally between the source/drain structure 130 and the gate structure 140 in the x axis direction.

One or more insulation layers 160, 162 are formed adjacent to the source/drain structure 130 and/or the gate structure 140. The insulation layers 160, 162 include silicon oxide or other suitable dielectric materials. Note that in FIG. 1A, some portions of the insulation layers 160, 162 are omitted to show the source/drain structure 130 and/or the nanowire stack 120, for illustrative purposes only. The insulation layers 160, 162 may be a single layer of a dielectric material, two separately formed layers of a same dielectric material or two layers of different dielectric materials.

FIG. 1A shows, as an illustrative example, that the source/drain structure 130 is formed such that an upper surface 132 of the source/drain structure 130 is substantially at a same level as that of the gate structure 140. This example is not limiting. Depending on design requirements, in other examples, the source/drain structure 130 is higher or lower than the gate structure 140, which are all included in the disclosure.

In an embodiment, the nanowire structures 122 that contact the source/drain structure 130 are configured as a channel region(s) of the device 100.

The substrate 110 may include a silicon substrate in crystalline structure and/or other elementary semiconductors like germanium. Alternatively or additionally, the substrate 110 may include a compound semiconductor such as silicon carbide, gallium arsenide, indium arsenide, and/or indium phosphide. Further, the substrate 110 may also include a silicon-on-insulator (SOI) structure. Substrate 110 may include an epitaxial layer and/or may be strained for performance enhancement. The substrate 110 may also include various doping configurations depending on design requirements such as P-type substrate and/or N-type substrate and various doped regions such as P-wells and/or N-wells.

The gate structure 140 is formed as a replacement gate. The following description lists examples of materials for the gate structure 140 including the gate electrode 142 and the gate dielectric 144, which are non-limiting. The gate electrode 142 includes a conductive material, e.g., a metal or a metal compound. Suitable metal materials for the gate electrode 142 include ruthenium, palladium, platinum, tungsten, cobalt, nickel, and/or conductive metal oxides and other suitable P-type metal materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, the gate electrode 142 includes a work function layer tuned to have a proper work function for enhanced performance of the field effect transistor devices. For example, suitable N-type work function metals include Ta, TiAl, TiAlN, TaCN, other N-type work function metal, or a combination thereof, and suitable P-type work function metal materials include TiN, TaN, other P-type work function metal, or combination thereof. In some examples, a conductive layer, such as an aluminum layer, a copper layer, a cobalt layer or a tungsten layer is formed over the work function layer such that the gate electrode 142 includes a work function layer disposed over the gate dielectric 144 and a conductive layer disposed over the work function layer and below a gate cap (not shown for simplicity). In an example, the gate electrode 142 has a thickness ranging from about 5 nm to about 40 nm depending on design requirements.

In example embodiments, the gate dielectric layer 144 includes an interfacial silicon oxide layer (not separately shown for simplicity), e.g., thermal or chemical oxide having a thickness ranging from about 5 to about 10 angstrom (Å). In example embodiments, the gate dielectric layer 144 further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer 144 includes a thickness ranging from about 10 to about 30 angstrom (Å) or other suitable thickness.

The outer spacer 150 is formed of a low K dielectric material such as silicon oxynitride ($SiO_xN_y$), silicon nitride ($Si_3N_4$), silicon monoxide (SiO), silicon oxynitrocarbide (SiONC), silicon oxycarbide (SiOC), vacuum and other dielectrics or other suitable materials. The outer spacer 150 may be formed through chemical vapor deposition (CVD), high density plasma CVD, spin-on, sputtering, or other suitable approaches.

The inner spacer 152 is formed of a high K dielectric material, e.g., higher dielectric constant than that of the outer spacer 150. The high K material for the inner spacer 152 includes one or more of silicon nitride $Si_3N_4$, silicon carbide (SiC), hafnium oxide ($HfO_2$) or other suitable high K dielectric material. In an embodiment, the K value of the inner spacer 152 material is between about three to four times of the K value of the outer spacer 150 material. In an example, the inner spacer 152 also includes one or more air gaps adjacent to one or more of the gate structure 140 or the source/drain structure 130.

The inner spacer 152 includes a first segment 152A formed between the gate structure 140 and the source/drain structure 130 and adjacent to a channel region (nanowire strip) 122. In an embodiment, the inner spacer structure 152 also includes a second segment 152B that extends upward adjacent the outer spacer 150. The second segment 152 B of the inner spacer 152 is further away from the channel region 122 than the first segment 152A. In this embodiment, a portion of the source/drain structure 130 may be separated from the gate structure 140 by both the inner spacer 152, specifically the second segment 152B of the inner spacer 152, and the outer spacer 150. In an embodiment, the first segment 152A is hat-shaped with a convex top of the hat shape pointing to the gate structure 140.

FIG. 1B is a cross-sectional view of the device 100 from cutting-line B-B. As shown in FIGS. 1A and 1B together, the gate structure 140 is adjacent to the nanowire stack 122 at at least three surfaces of the nanowire stack 120, i.e., the upper surface and the side surfaces. FIG. 1B shows that the gate structure 140 wraps around one or more of the individual nanowire structures 122. As shown in FIG. 1B, both the gate electrode 142 and the gate dielectric 144 wrap around an individual nanowire structure 122, which is not limiting. It is possible that only the gate dielectric 144 wraps around an individual nanowire structure 122 and the gate electrode 142 is adjacent to three surfaces of the nanowire stack 120 as a whole.

In an embodiment, as shown in FIG. 1B, a nanowire structure 122 includes an edge segment (first segment) 124 and a ring portion 126 (second segment) adjacent to the edge segment 124. The ring segment 126 has a larger diameter than the edge segment 124. In a further embodiment, the nanowire structure 122 also includes a center segment 128 that has a diameter smaller than the diameter of the ring segment 126. Other shapes or profiles of the nanowire structure 122 are also possible and included in the disclosure.

In an embodiment, the first segment 152A of the inner spacer structure 152 "inner spacer 152A" includes a substantially dome-shaped profile. As used in this disclosure, a dome-shaped profile includes all profiles that have a larger base and a smaller apex. A cone shape or a pyramid shape or other similar shapes are all included in the "dome-shaped profile" as used in this disclosure. The apex of the dome-shaped inner spacer 152A is oriented toward the gate structure 140. Further, the dome-shaped profile may include more than one apexes and include a concave portion between two apexes.

FIG. 1D shows an enlarged cross-sectional view of the inner spacer 152A taken from FIG. 1B. As shown in FIG. 1D, the inner spacer 152A includes a substantially hat-shaped profile, with the convex top of the hat shape pointing to the gate structure 140. The hat-shaped profile includes a convex portion, e.g., a dome-shaped portion, 154 and a brim-shaped portion 156 projecting from dome-shaped portion 154. The dome-shaped portion 154 and the brim-shaped portion 156 meet at an interface 158. In some scenarios, the dome-shaped portion 154 smoothly transit into the brim-shaped portion 126 and the first segment 152A thus overall includes a dome-shaped profile.

Figure 1C:
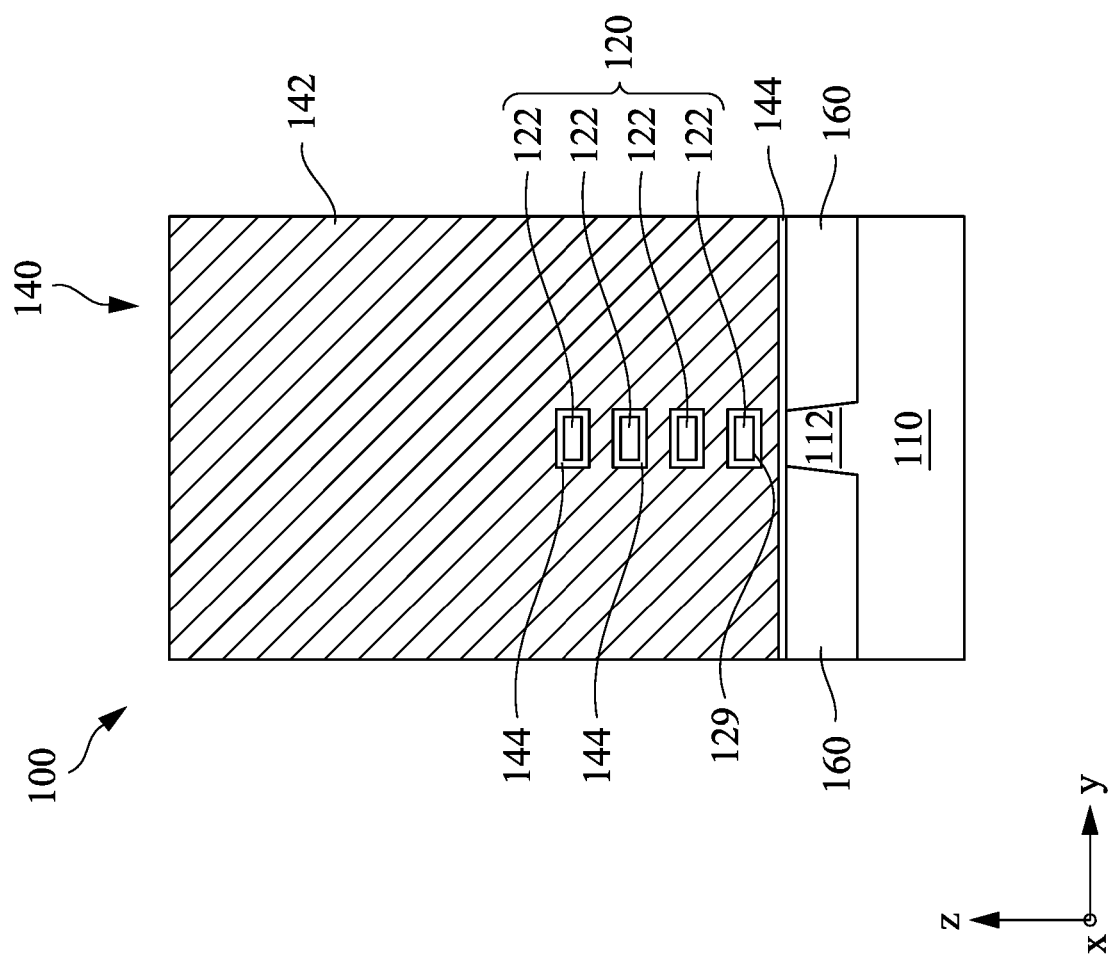
Figure 1E:
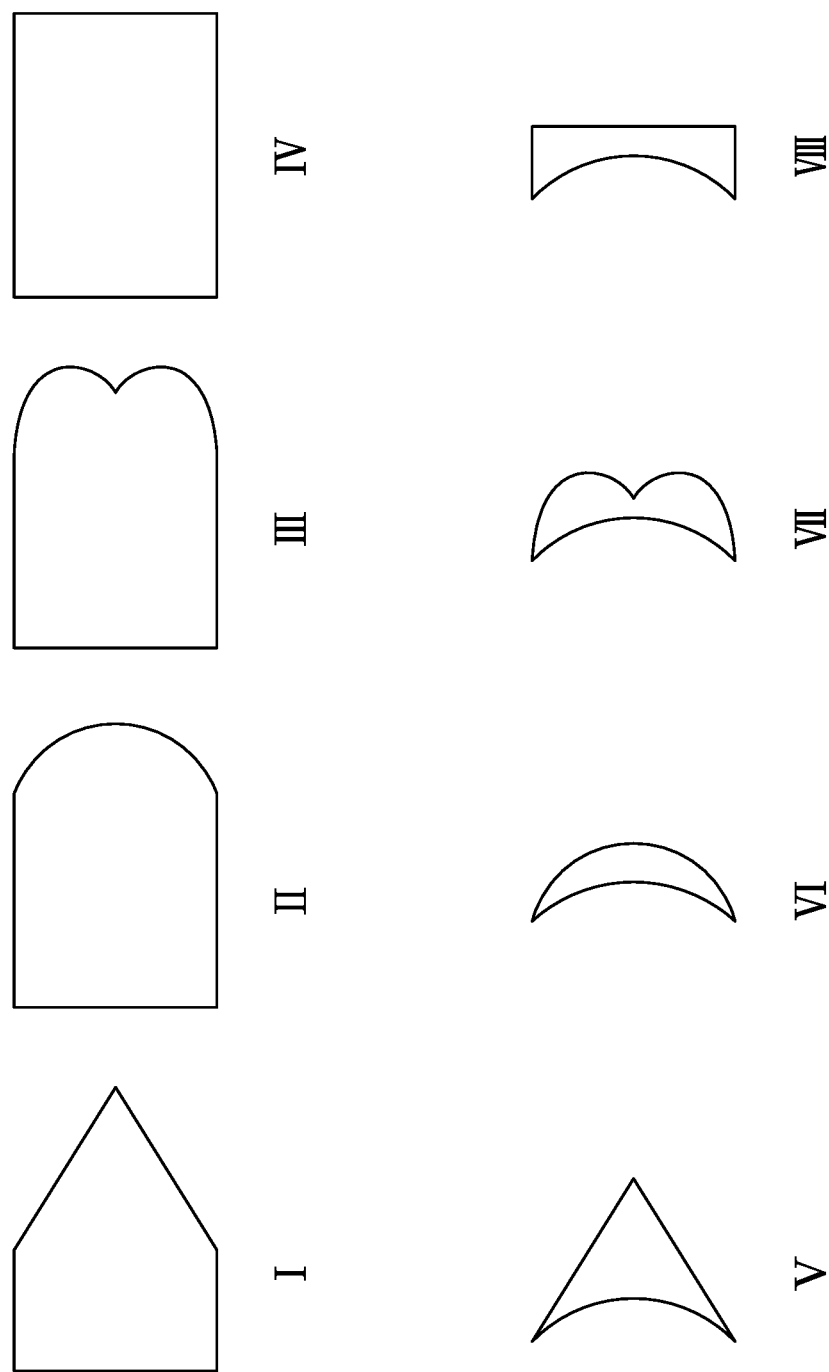

FIG. 1E includes alternative or additional profile embodiments of the inner spacer 152A from a cross-sectional view. Example I shows that the inner spacer 152A may include a cone-shaped head portion proximal to the gate structure 140 and a base portion distal to the gate structure 140. Example II shows that the inner spacer 152A may include a dome-shaped head portion proximal to the gate structure 140 and a distal base portion. Example III shows that the inner spacer 152A may include a multidome-shaped head portion proximal to the gate structure 140 and a distal base portion. Example IV shows that the inner spacer 152a may include a continuous shape from the proximal end (with respect to the gate structure 140) to the distal end.

Example I-IV show various profiles of the head portion with the base portion extending from the head portion. In examples I-IV, the edge surface of the base portion is substantially plumb or vertical. Examples V-VIII show various examples where the edge surface of the base portion includes an indentation or recess toward the gate structure 140. Examples V-VIII show that the base portion is minimized to become a recessed base surface, which is not limiting. The recessed base surface may also exists in a scenario that the base portion extends away from the head portion. For example, the brim-shaped portion 156 of FIG. 1D may also include a recess base surface.

In an embodiment, the source/drain structure 130 extends continuously downward from a nanowire structure 122 that is stacked higher in the nanowire stack 120 ("higher nanowire structure 122") to a nanowire structure 122 that is stacked lower in the nanowire stack 120 ("lower nanowire structure 122"). The source/drain structure 130 contacts the higher nanowire structure 122 and the lower nanowire structure 122 by the edge surfaces 122E thereof, respectively.

In an embodiment, as shown in FIG. 1B, all the nanowire structure 122 contacts the source/drain structure 130, which is not limiting. In other scenarios, depending on fabrication process and product design, some of the nanowire structures 122, e.g., those stacked on the top of the nanowire stack 120, do not contact the source/drain structure 130. For example, the inner spacer structure 150 may be formed between a topmost nanowire structure 122 and the source/drain structure 130.

FIG. 1C is a cross-sectional view of the device 100 from cutting-line C-C in FIG. 1A. As shown in FIGS. 1A and 1C together, multiple nanowire structures 122 of the nanowire stack 120 are wrapped around or surround by the gate structure 140. Specifically, as shown in FIG. 1C, the nanowire structures 122 are each surrounded directly by the gate dielectric 144, which is positioned between the gate electrode 142 and the nanowire structure 122.

The nanowire stack 120 is formed over the lower fin structure 112 of the substrate 110 and overlaps the lower fin structure 112. FIG. 1C shows, as an illustrative example, that the lowest nanowire structure 122 of the nanowire stack 120 is separated from the lower fin structure 112 of the substrate 110, which is not limiting. In other embodiments, depending on the design requirements, the lowest nanowire structure 122 contacts the lower fin structure 112. That is, the bottom surface (or lower surface) 129 of the lowest nanowire 122 in the nanowire stack 120 may not be adjacent to the gate structure 140. For example, in the scenario that the nanowire structure 122 and the substrate 110 are formed of a same semiconductor material, e.g., silicon, it may meet some design requirements to have the lowest nanowire structure 122 contact the lower fin portion 112.

Figure 2:
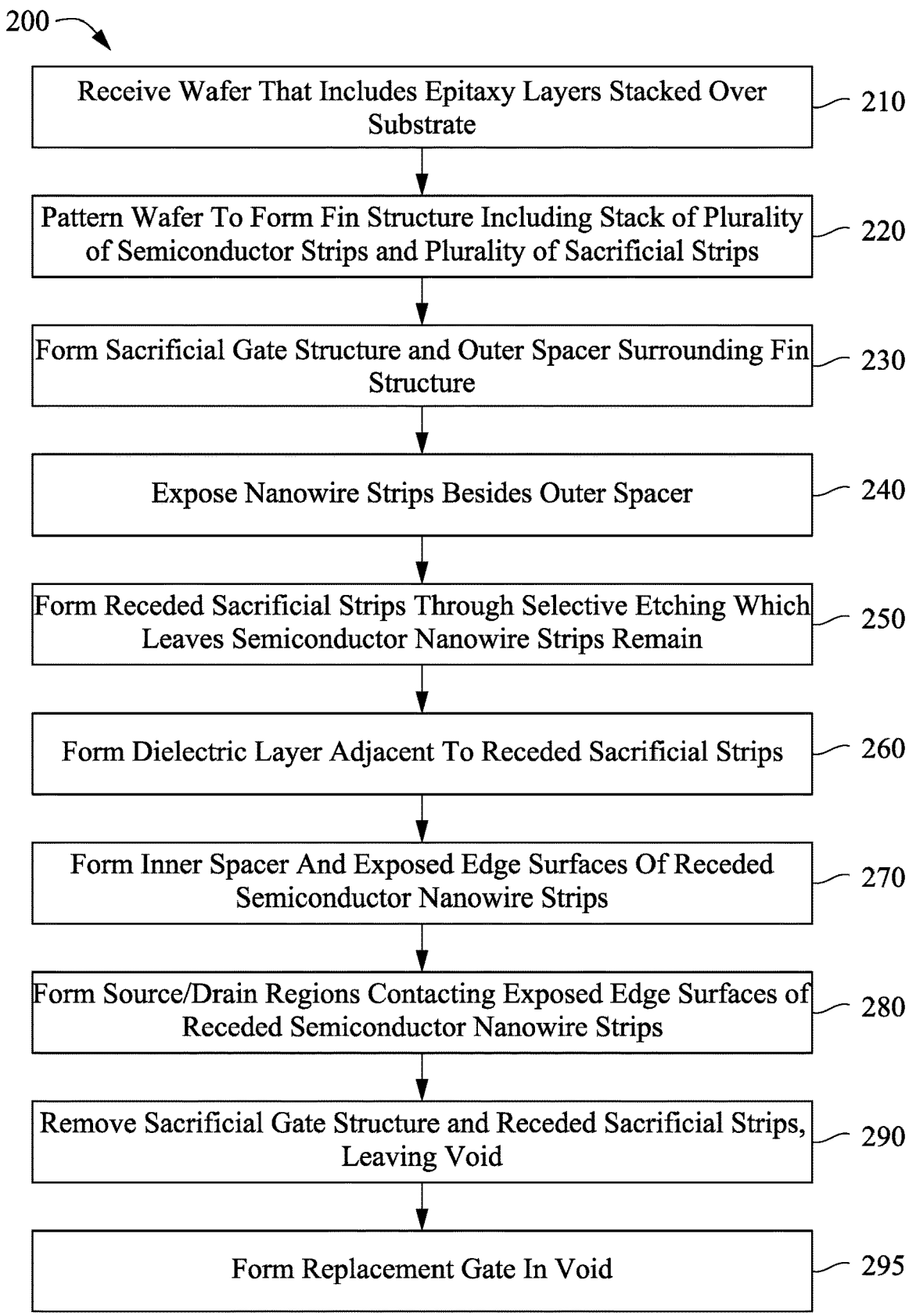
FIG. 2 is a flow chart of an example fabrication process according to example embodiments of the disclosure.

FIG. 2 is an example fabrication process 200, which could be used to make the example device 100 sown in FIGS. 1A-1D, and other devices. FIGS. 3-12 show stages of a wafer 300 in a process of making the example device 100. At each stage, one or more of three views of the wafer 300 are shown, i.e., the perspective view referenced with letter "A", a sectional view from cutting line B-B, referenced with letter "B" and also referred to as "B" plane (X-Z plane), and a sectional view from cutting line C-C, referenced with letter "C" and also referred to as "C" plane. At some of the stages, only one view of the wafer 300 is shown and the reference letter of the respective view will be omitted for simplicity.

Figure 3B:
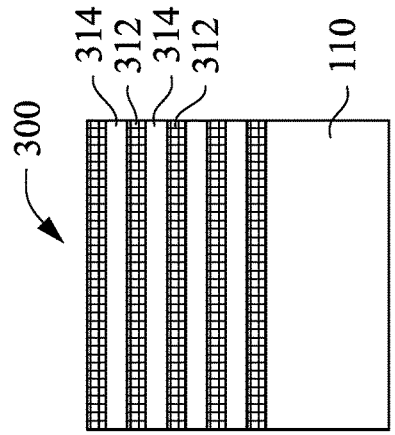
Figure 3C:
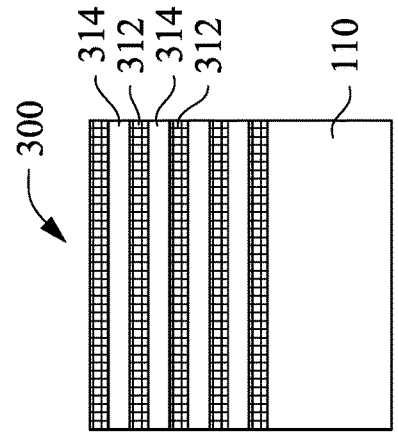
Figure 3A:
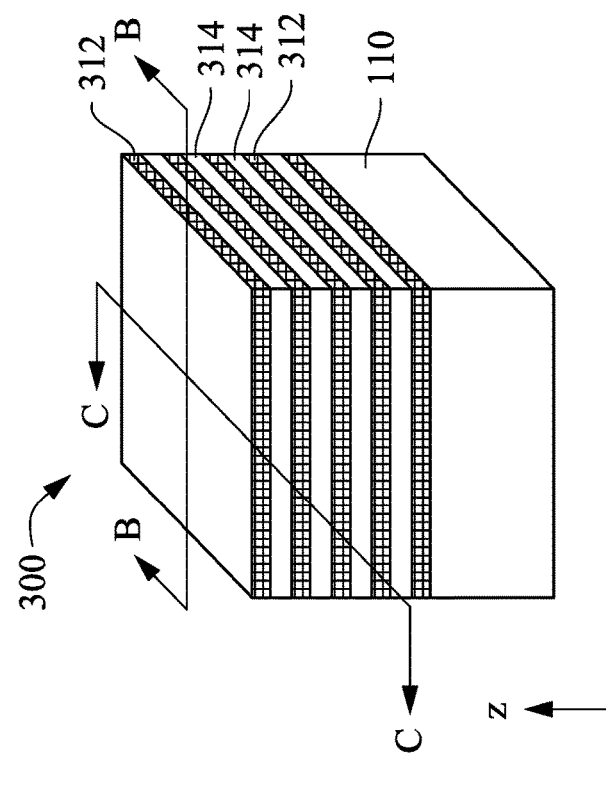

Referring to FIG. 2, with reference also to FIGS. 3A-3C, in example operation 210, a wafer 300 is received. FIGS. 3A-3C illustrate the wafer 300.

The wafer 300 includes a substrate 110, e.g., of silicon, silicon germanium, and/or other suitable semiconductor materials. For example, the substrate 110 may include a compound semiconductor such as silicon carbide, gallium arsenide, indium arsenide, and/or indium phosphide. Further, the substrate 110 may also include a silicon-on-insulator (SOI) structure.

A vertical stack of epitaxy layers 312, 314 of different materials are formed over the substrate 110 and are stacked in an alternating sequence, i.e., each epitaxy layer 312, 314 is immediately and vertically adjacent to a different one of the epitaxy layers 314, 312. FIGS. 3A-3C show, as an illustrative example, that totally four epitaxy layers 312 and five epitaxy layers 314 are stacked over the substrate 110, which is not limiting. Other numbers of the epitaxy layers 312, 314 are also possible and included in the disclosure. In an embodiment, the wafer 300 includes a same number of the epitaxy layers 312 as the epitaxy layers 314. In another embodiment, the wafer 300 includes a different number of the epitaxy layers 312 from that of the epitaxy layers 314.

The epitaxy layers 312 are formed of a first semiconductor material and the epitaxy layers 314 are formed of a second semiconductor material different from the first semiconductor material. In an embodiment, the first semiconductor material and the second semiconductor material have different etching rates with respect to some etchants, i.e., having etching selectivity, such that a selective etching may be conducted to remove one of the epitaxy layers 312, 314 with the other one remaining. In an embodiment, the epitaxy layer 312 is silicon germanium of $Si_xGe_{1-x}$, with x being greater than 0 and smaller than 1, and in some embodiments between about 0.4 and about 0.9. In an embodiment, the epitaxy layer 314 is silicon.

The epitaxy layers 312, 314 each may be doped in various approaches with various dopants/impurities, like arsenic, phosphorous, boron, gallium, indium, antimony, oxygen, nitrogen, or various combinations thereof.

In an embodiment, the epitaxy layers 312, 314 each are sheets of nanowire silicon germanium or nanowire silicon, respectively, and are referred to as nanosheets 312, 314. Each of the nanosheets 312, 314 may include a thickness between about 4 nm to about 20 nm. In some embodiments, the nanosheets 312, 314 each may include a thickness between about 5 nm to about 8 nm.

The epitaxy layers 312, 314 may also be other semiconductor materials.

Epitaxy layers 312, 314 may be formed using the vapor-liquid-solid (VLS) technique or other suitable growth procedures. In the description herein, the nanosheets 314, 312 of 1-D nanowire silicon or silicon germanium, respectively, are used as illustrative examples in the description of the disclosure.

The nanosheets 312, 314 may be globally formed over the substrate 110 or may be locally formed over the substrate 110. In a local formation procedure, the nanosheets 312, 314 are formed within an area defined by shallow trench insulation (STI) regions and/or is formed over a doped substrate region, e.g., a P-well or an N-well.

Referring back to FIG. 2, with respect also to FIGS. 4A-4C, in example operation 220, a fin structures 402 are formed by patterning the wafer 300. Any suitable patterning procedures may be used and all are included in the disclosure. The fin structure 402 includes two portions, an upper portion 410 and a lower portion 112. The lower portion 112 is formed from patterning the substrate 110, e.g., of silicon, and is also part of the substrate 110 and is referred to as the "substrate" or the "lower fin portion" or the "lower portion" of the fin, as scenarios apply. The upper portion 410 is formed from patterning the stacked epitaxy layers 312, 314. In the example case that the epitaxy layers 312, 314 are nanosheets, the upper fin portion 410 include nanowires silicon germanium strips 412, and nanowire silicon strips 414 vertically stacked in an alternating manner. The upper fin portion 410 including the stack of the nanowire strips 412, 414 are also referred to as nanowire stack 410. Note that the nanowire stack 410 is different from the nanowire stack 120 of device 100 shown in FIGS. 1A-1C because one group of the nanowire strips 412, 414 will be removed as sacrificial strips, as described herein.

In the following fabrication stages, either the nanowire strips 412 or the nanowire strips 414 will be removed from the nanowire stack 410 and are referred to as the "sacrificial strips". The nanowire strips 412, 414 that remain on the nanowire stack 410 are referred to as the "semiconductor nanowire strips." As illustrative examples, the silicon germanium nanowire strips 412 are removed as sacrificial strips and the silicon nanowire strips 414 remain to eventually become the nanowire structures 122 of the nanowire stack 120 of device 100.

An insulation layer 160 is formed over the substrate 110 and adjacent to the fin structures 402, as shown in FIG. 4A (in FIG. 4A, a portion of the insulation layer 160 is omitted for illustrative purposes) and FIG. 4C. In an embodiment, the insulation layer 160 is silicon oxide or other suitable dielectric material. In some embodiments, an etch stop layer 420 is formed between the insulation layer 160 and the substrate 110 including the lower portion 112 of the fin structure 402. The etch stop layer 420 is a different dielectric material from the insulation layer 160. In an embodiment, the etch stop layer 420 is silicon nitride or other suitable dielectric materials. In an embodiment, the insulation layer 160 and the etch stop layer 420 are adjacent only to the lower fin portion 112, and the upper fin portion 410 is exposed from the insulation layer 160 and the etch stop layer 420.

Figure 5B:
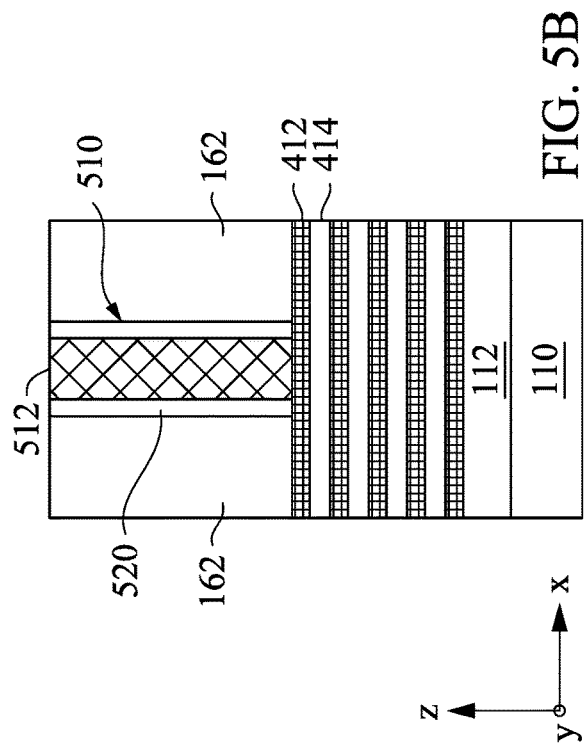
Figure 5C:
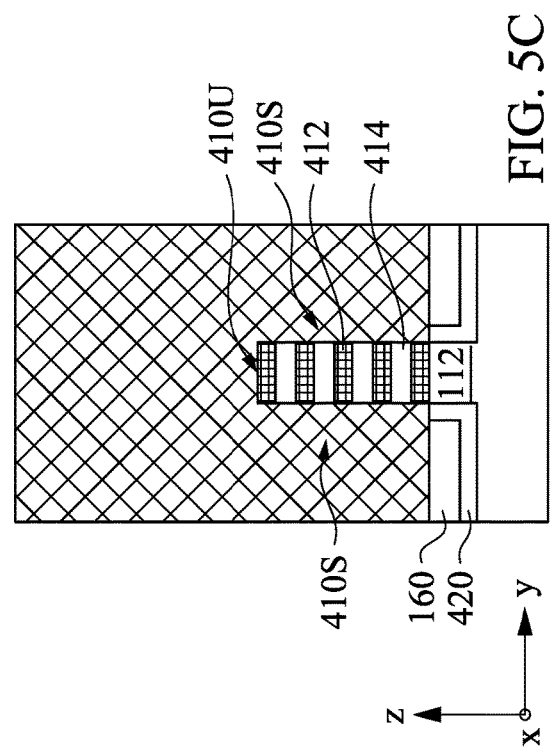
Figure 5A:
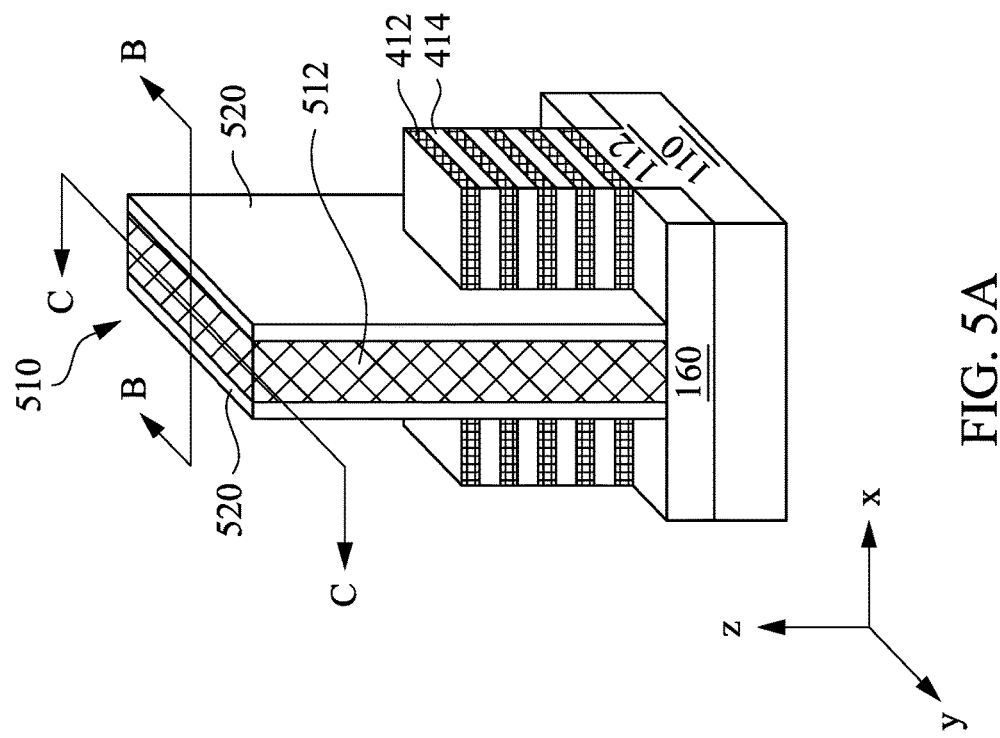

Referring back to FIG. 2, with reference also to FIG. 5A-5C, in example operation 230, a sacrificial or dummy gate structure 510 is formed over the substrate 110 and adjacent to or surround three surfaces of the upper fin portion 410, i.e., two side surfaces 420S and an upper surface 410U. In an embodiment, the sacrificial gate structure 510 may include a sacrificial polysilicon layer 512, a sacrificial cap layer (not shown for simplicity), and a sacrificial liner layer (not shown for simplicity). The sacrificial cap layer and the sacrificial liner layer may be silicon oxide or other suitable dielectric materials. The total height of the sacrificial gate structure 510 may be higher or substantially equal to, but not lower than, the replacement gate that is to be made in the space occupied by the sacrificial gate structure 510.

An outer spacer 520 is formed adjacent to the sacrificial gate structure 510. The outer spacer 520 may be silicon nitride or other suitable dielectric materials. The outer spacer 150 is formed of a low K dielectric material such as silicon oxynitride, silicon nitride ($Si_3N_4$), silicon monoxide (SiO), silicon oxynitrocarbide (SiONC), silicon oxycarbide (SiOC), silicon mononitride (SiN), vacuum and other dielectrics or other suitable materials. The outer spacer 520 may be formed through chemical vapor deposition (CVD), high density plasma CVD, spin-on, sputtering, or other suitable approaches.

As shown in FIGS. 5A and 5B, the nanowire strips 412, 414 each laterally extends beyond the outer spacer 520 in the x-axis direction.

Before or after the formation of the sacrificial gate structure 510 and the outer spacer 520, an insulation layer 162 is formed adjacent to the outer spacer 520. The insulation layer 162 may include a same dielectric material as the insulation layer 160 or may be a different dielectric material. The insulation layer 162 is omitted from FIG. 5A for illustrative purposes.

FIGS. 6-12 show B plane view of the wafer 300 in the various fabrication stages.

Figure 6:
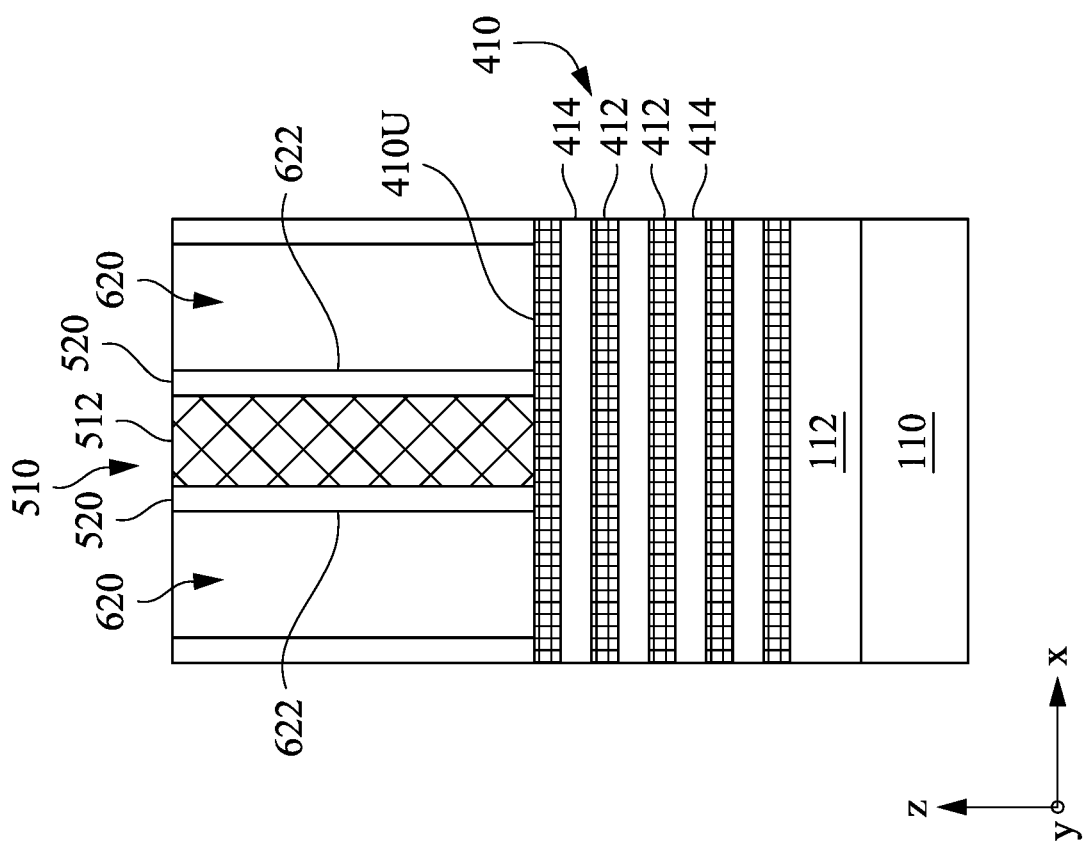

Referring back to FIG. 2, with reference also to FIG. 6, in example operation 240, a trench or aperture 620 is formed within the insulation layer 162 to expose the nanowire stack 410 by each side of the outer spacer 520. In an embodiment, a portion 622 of the outer spacer 520 that overlaps the nanowire stack 410 is also exposed. FIG. 6 shows that the aperture 620 stops substantially at the level of the topmost nanowire strip, here the sacrificial nanowire strip 412 of silicon germanium, which is not limiting. In other embodiments, a portion of one or more of the top nanowire strips 412, 414 may be removed. That is, the aperture 620 may extend downward beyond the upper surface 410U of the nanowire stack 410.

Figure 7:
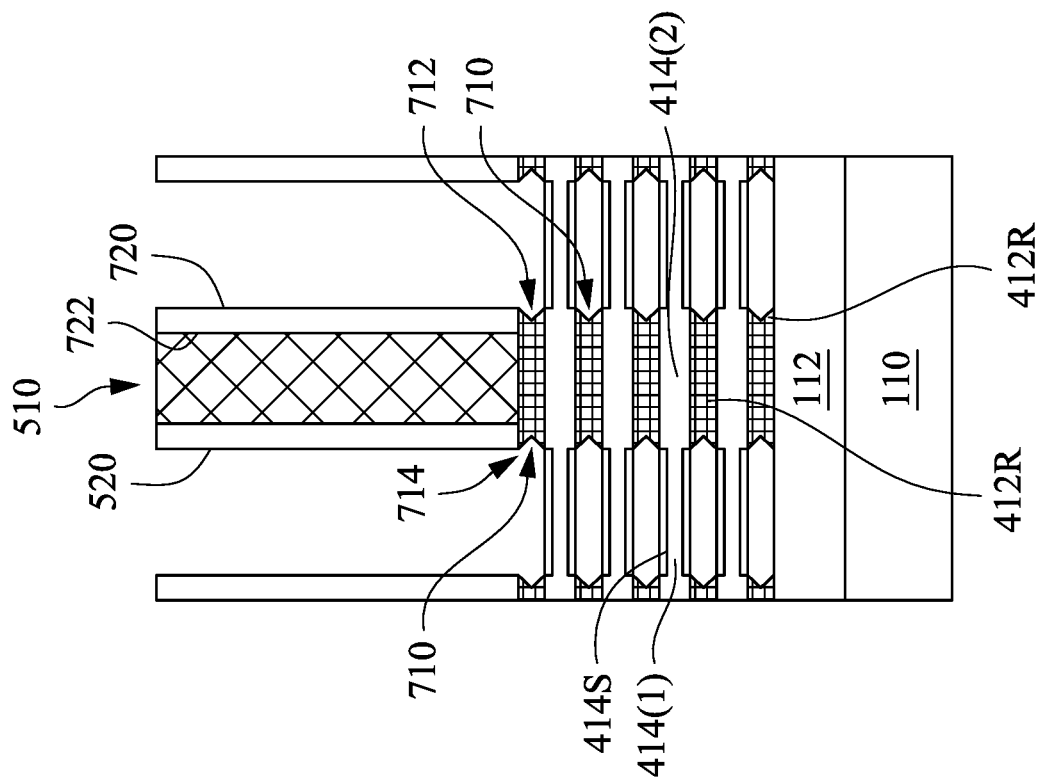

Referring back to FIG. 2, with reference also to FIG. 7, in example operation 250, a selective etching is conducted through the apertures 620 to selectively remove the sacrificial nanowire strips 412 of silicon germanium exposed from the apertures 620 and to leave the semiconductor nanowire strip 414 of silicon remain within the aperture 620. In an embodiment, an ammonia solution of ammonium hydroxide "$NH_4OH$" or other suitable etchants are used to selectively etch out the sacrificial nanowire strips 412. In the case that the nanowire strips 414 of silicon are used as the sacrificial nanowire strips, a hydrochloric acid solution "HCL" or other etchants is used to selectively etch out the nanowire strips 414 and while leaving the nanowire strips 412 of silicon germanium in place.

In an embodiment, a selective wet etching is performed to remove the sacrificial nanowire strips 412 (or 414) such that a recess 710 is formed on the edge portions 712 of the sacrificial nanowire strips 412 that remain below the sacrificial gate structure 510 and the outer spacer 150, which is referred to herein as "receded sacrificial strip 412R" for descriptive purposes.

In an embodiment, the etching conditions are controlled such that the edge portions 712 of the remaining sacrificial strips 412R recede inward beyond the outer surface 720 of the outer spacer 150. In an embodiment, the outermost points 714 of the edge portions 712 are positioned between the outer surface 720 and the inner surface 722 of the outer spacer 150.

The receding of the sacrificial strips 412 unavoidably also removes a small portion 414S (shown in dotted line) of the semiconductor nanowire strips 414. As a result, a first segment 414(1) of the nanowire strip 414 that is exposed within the aperture 620 includes a smaller diameter than a second segment 414(2) that is below the sacrificial gate structure 510 and is not exposed within the aperture 620. This structural characteristic of this stage of the wafer is enabled by the sequence of the fabrication process that the sacrificial strips 412 are selectively removed while the semiconductor nanowire strips 414 remain. This structural characteristic that the segment 414(1) includes a smaller diameter than the second segment 414(2) also affects the shapes of the other structural features, like the inner spacer 152A of FIG. 1D, as described herein.

Figure 8:
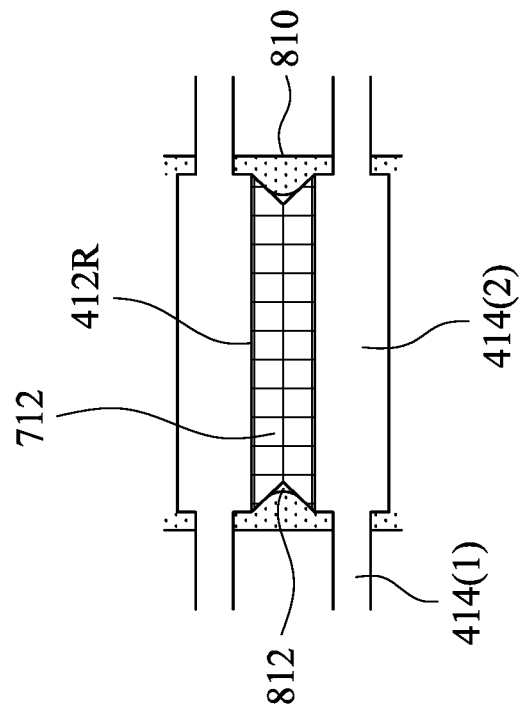
Figure 8:
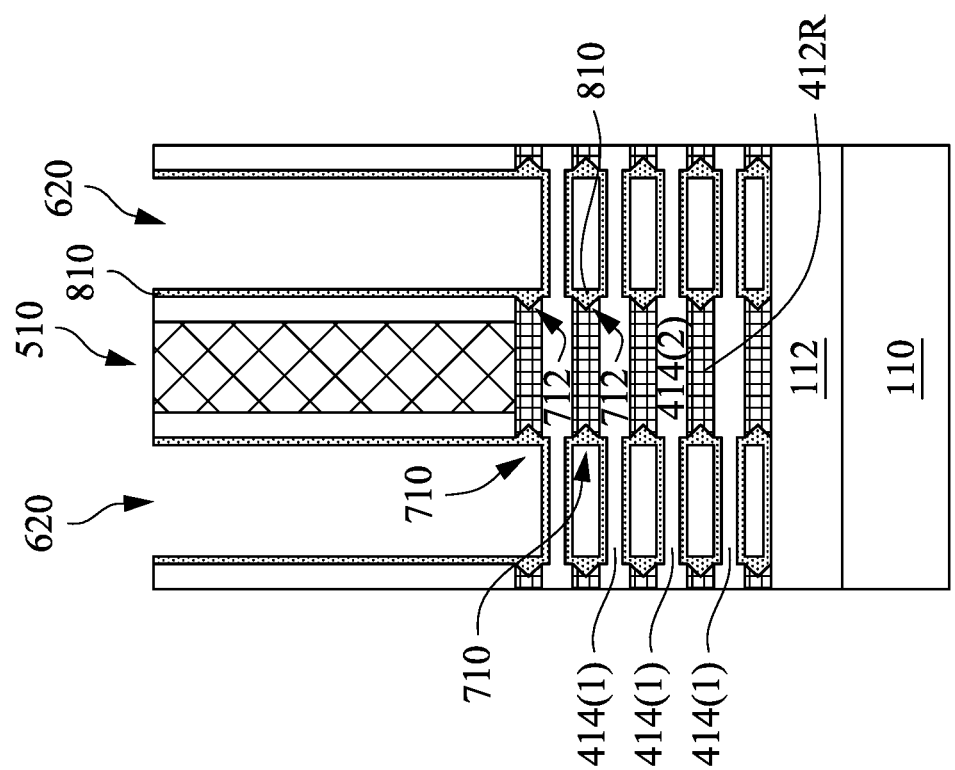

Referring back to FIG. 2, with reference also to FIG. 8, in example operation 260, a dielectric layer 810 is formed adjacent to the edge portions 712 of the receded sacrificial strips 412R that remains below the sacrificial gate structure 510. The dielectric layer 810 at least partially fills in the recesses 710 adjacent to the edge portions 712. In an example, the dielectric layer 810 does not fully fill the recesses 710 and a gap, either air gap or vacuum gap, is formed between the dielectric layer 810 and the edge portion 712 of the receded sacrificial strip 412R. FIG. 8' shows the gap 812 in an enlarged view.

In an embodiment, the dielectric layer 810 is formed of a dielectric material that has a higher dielectric constant than the outer spacer 520. The dielectric material for the inner spacer 152 includes one or more of silicon nitride $Si_3N_4$, silicon carbide (SiC), hafnium oxide ($HfO_2$) or other suitable dielectric material. In an embodiment, the K value of the dielectric layer 810 material is between about three to four times of the K value of the outer spacer 520 material.

In an embodiment, the dielectric layer 810 is also formed over the first segment 414(1) of the semiconductor nanowire strip 414.

Figure 9:
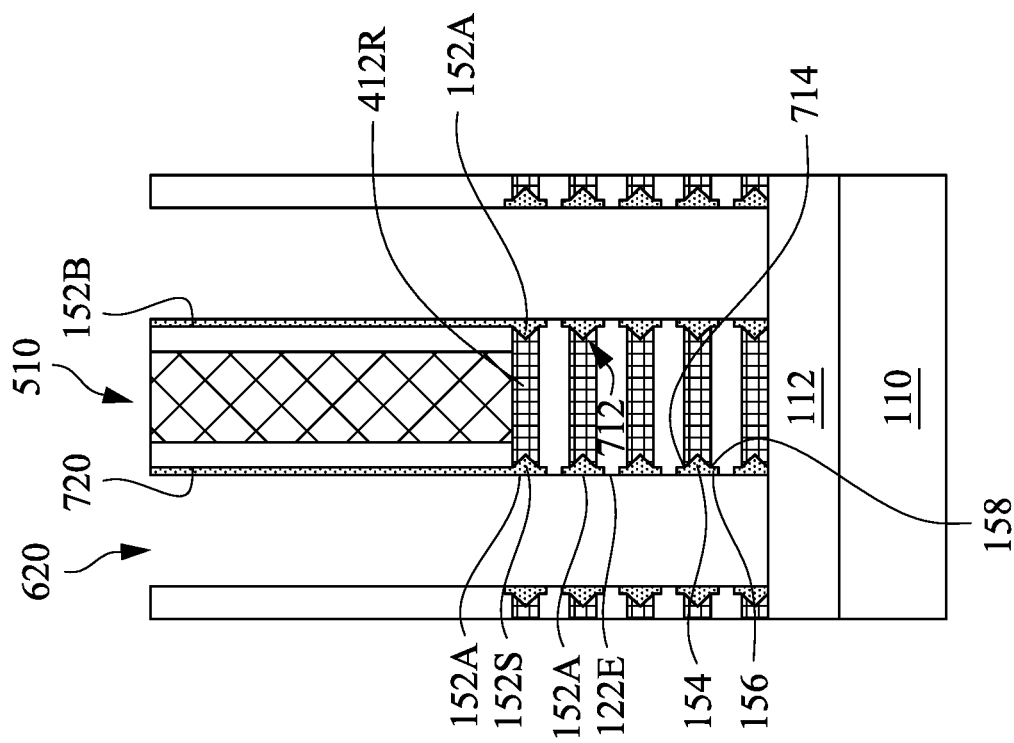

Referring back to FIG. 2, with reference also to FIG. 9, in example operation 270, inner spacers 152A are formed by removing extra portions of the dielectric layer 810 through an anisotropic etching. In an embodiment, a resultant surface 152S of the inner spacer 152A, which is opposite to the receded sacrificial strip 412R, is substantially plumb with the outer surface 720 of the outer spacer 520. In another embodiment, the surface 152S is formed outwardly beyond the outer surface 720 of the outer spacer 520. Further, in an embodiment, a thin layer 152B of the dielectric layer 810 remains adjacent to the outer spacer 520 and may become a second segment 152B of the inner spacer structure 152 (152A+152B). Note that the second segment 152B is technically not an "inner spacer" and is referred to as a second segment of the inner spacer structure 152 only for descriptive purposes.

In an embodiment, the first segment 152A of the inner spacer 152, "inner spacer 152A" includes a substantially dome-shaped profile due to filling the recesses 710. As used in this disclosure, a dome-shaped profile includes all profiles that have a larger base and a smaller apex. A cone shape or a pyramid shape or other similar shapes are all included in the "dome-shaped profile" as used in this disclosure. Other alternative or additional shapes/profiles of the inner spacer 152 or the first segment 152A are also possible. The apex of the dome-shaped inner spacer 152A is directed toward the receded sacrificial strips 412R.

In an embodiment, as the first segment 414(1) of the semiconductor nanowire strip 414 has a smaller diameter than the second segment 414(2) of the semiconductor nanowire strip 414, the inner spacer 152A includes a substantially hat-shaped profile. The hat-shaped profile includes a dome-shaped portion 154 and a brim-shaped portion 156 projecting from dome-shaped portion 154. The dome-shaped portion 154 and the brim-shaped portion 156 meet at an interface 158. In some scenarios, the interface 158 overlaps with the outermost point 714 of the receded sacrificial strip 412R (also see FIG. 7). In some scenarios, the dome-shaped portion 154 smoothly transit into the brim-shaped portion 156 and the inner spacer 152A thus overall includes a dome-shaped profile.

The semiconductor nanowire strips 414 are receded, through which portions of the first segment 414(1) are removed simultaneously with or after the extra portion of the dielectric layer 810 is removed. That is, the edge surfaces 122E of the plurality of the semiconductor strips are formed one of simultaneously with or after the inner spacer 152, or specifically the first segment 152A, is formed. As a result, the edge surfaces 122E of the receded semiconductor nanowire strips 414 are exposed from the inner spacers 152A. In an embodiment, the edge surfaces 122E are substantially plumb with the surfaces 154 of the inner spacers 152A. In another embodiment, the edge surfaces 122E extend out from the inner spacers 152A.

Figure 10:
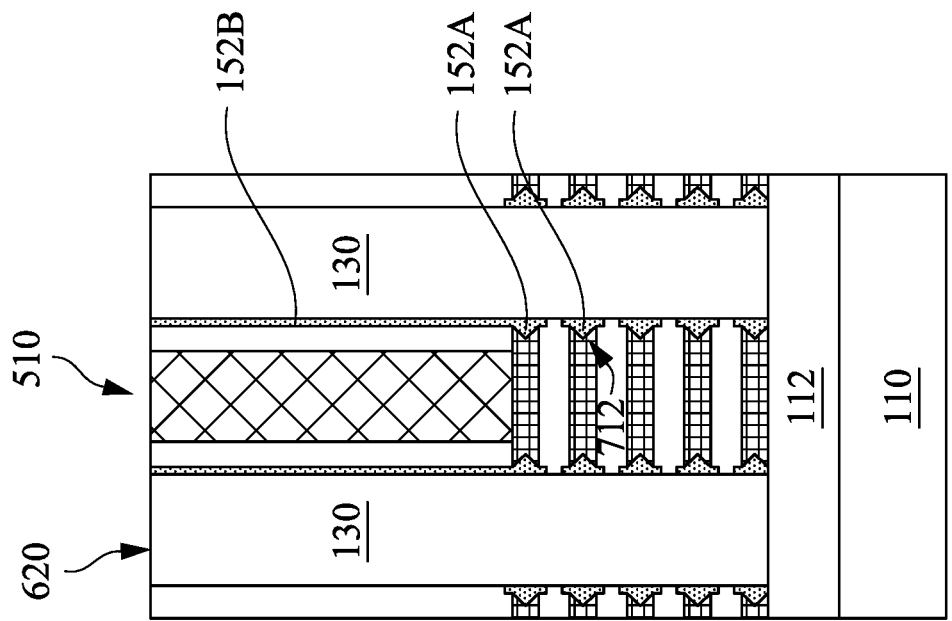

Referring back to FIG. 2, with reference also to FIG. 10, in example operation 280, semiconductor regions 130 are formed within the apertures 620 using epitaxy processes. Specifically, the semiconductor regions 130 are formed adjacent to the inner spacer 152A (and optionally also 152B) and contacting the edge surfaces 122E of the receded semiconductor nanowire strips 414, which are exposed from the inner spacers 152A.

In the scenario that the semiconductor nanowire strips 414 are silicon, the device is configured as an nMOS and the semiconductor regions 130 are silicon carbide (SiC), silicon carbon phosphide (SiCP), silicon phosphide (SiP) or other suitable semiconductor materials. In the scenario that the nanowire strips 412 of silicon germanium remain as the semiconductor nanowire strips, the device is configured as a pMOS, and the semiconductor regions 130 are silicon germanium (SiGe) or silicon-germanium-boron (SiGeB) or other suitable semiconductor materials. The semiconductor regions 130 may be doped in various approaches with various dopants/impurities, like arsenic, phosphorous, boron, gallium, indium, antimony, oxygen, nitrogen, or various combinations thereof.

In an embodiment, the semiconductor regions 130 are formed to contact each exposed edge surfaces 122E of the semiconductor nanowire strips 414.

Figure 11:
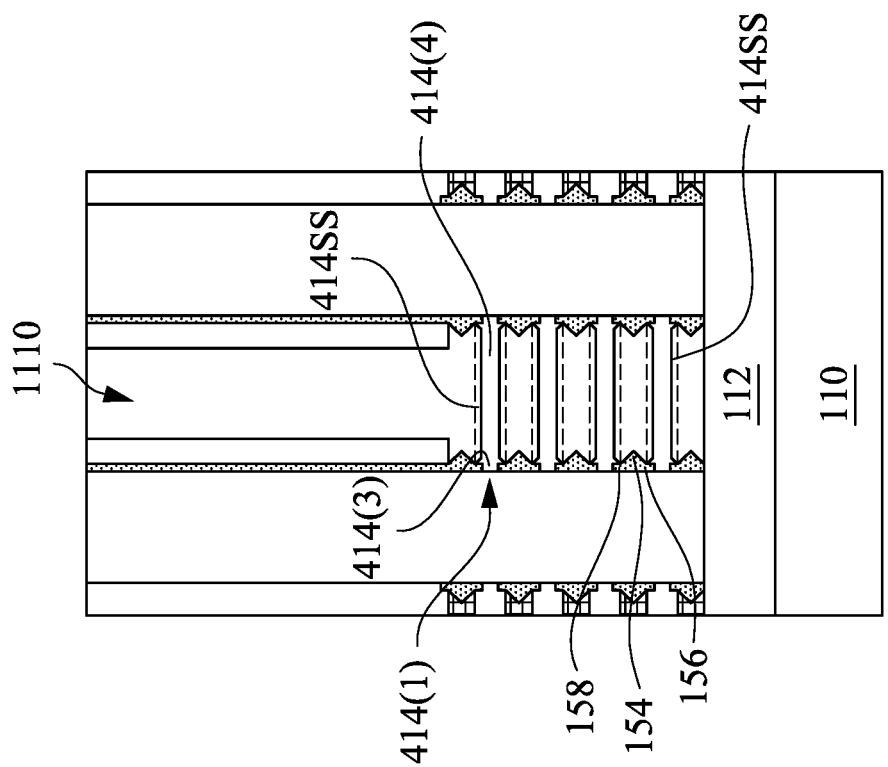

Referring back to FIG. 2, with reference also to FIG. 11, in example operation 290, the receded sacrificial nanowire strips 412R and the sacrificial gate structure 510 are removed, leaving a void 1110. A selective etching procedure is done to remove the receded sacrificial strips 412R with the receded semiconductor nanowire strips 414 remaining. The selective etching unavoidably removes also a portion 414SS (shown in dotted line) from the second segment 414(2) (FIG. 8) of the semiconductor nanowire strips 414. Due to the dome-shaped portions 154 of the inner spacers 152A, the removal of the portions 414SS forms a ring segment 414(3) and a center segment 414(4) of the receded semiconductor nanowire strip 414. The center segment 414(4) includes a smaller diameter than the ring segment 414(3). As a result, the receded semiconductor nanowire strips 414 become the nanowire structures 122 of FIG. 1B, which each includes an edge segment 124, a ring segment 126, and a center segment 128 (FIG. 1B).

Figure 12:
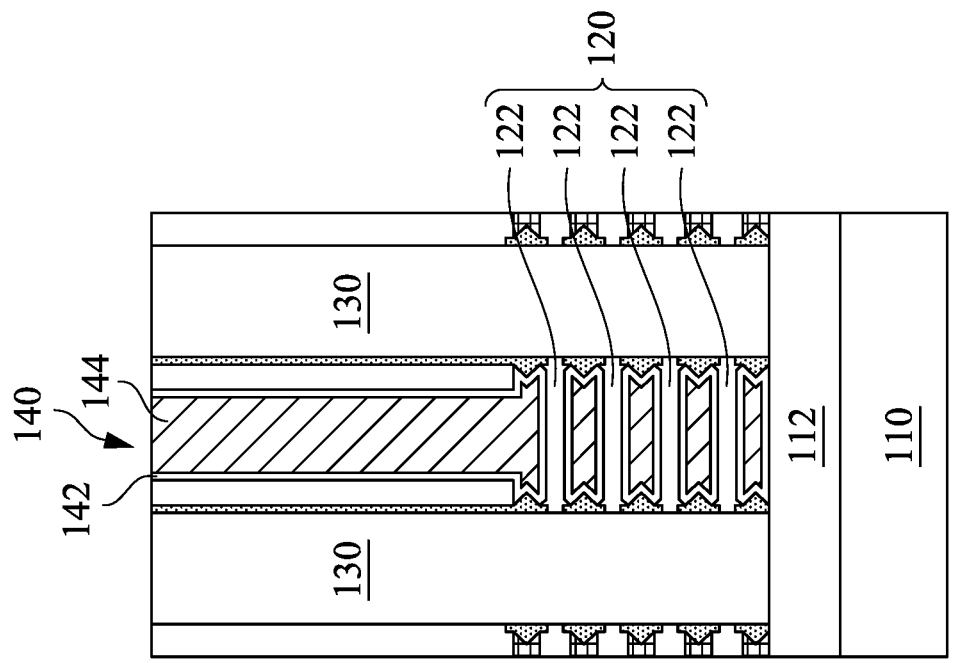

Referring back to FIG. 2, with reference also to FIG. 12, in example operation 295, a replacement gate structure 140 including a gate electrode 142 and a gate dielectric 144 is formed within the void 1110. The replacement gate structure 140 wraps around the semiconductor nanowire strips 122 of the nanowire stack 120.

As the edge surfaces 122E of the semiconductor nanowire structures 122 are exposed simultaneously with or after the formation of the inner spacer 152A, the edge surfaces 122 are not covered by the dielectric layer of the inner spacer 152A. As such, the junction between the semiconductor nanowire structure 122, configured as the channel region, and the source/drain region 130 is Ohmic and the contact resistance is low.

Figure 13:
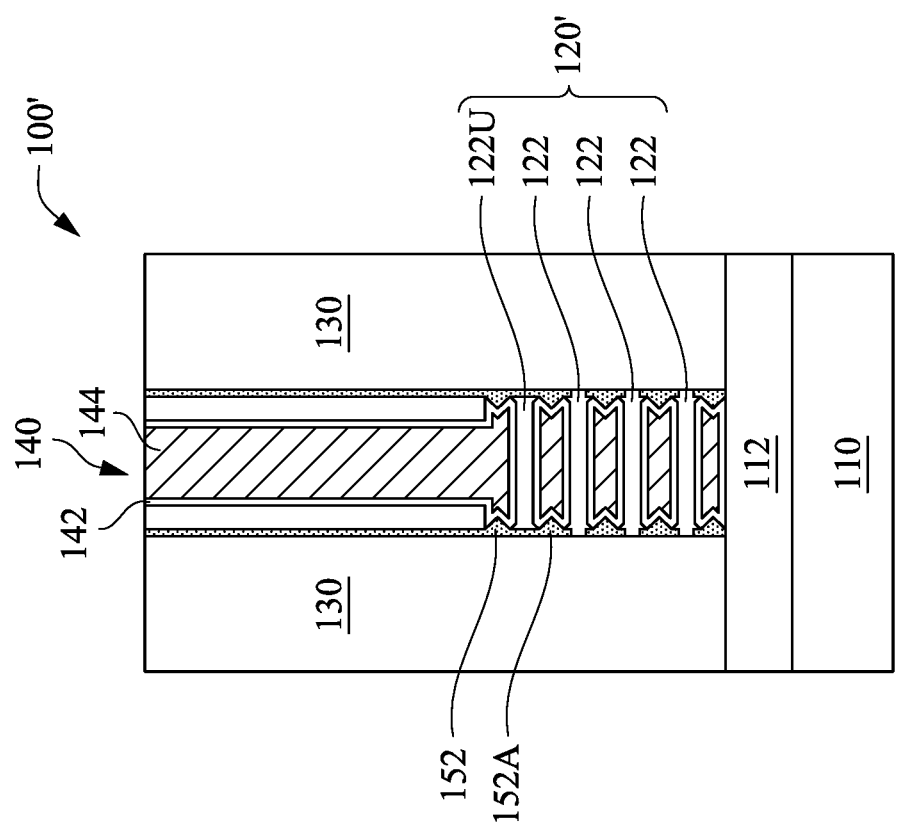

FIG. 12 shows one example embodiment of the structure 110, which does not limit the scope of the disclosure. Other embodiments may include some variant structure features without changing the principles of the disclosure. For example, FIG. 13 shows an alternative and/or additional structure 100'. In the structure 100', some of the semiconductor strips 122 are not exposed from the inner spacer 152, or specifically the first segment 152A. For example, in the structure 100', an upper level semiconductor strip 122U is receded before the inner spacer 152 is formed and is covered by the inner spacer 152. The upper level semiconductor strip 122U may be receded together with some of the sacrificial strips 412 or may be receded separately from the sacrificial strips 412. The receding of the upper level semiconductor strip 122U may be implemented based on fabrication process design and/or product/device design.

Figure 14:
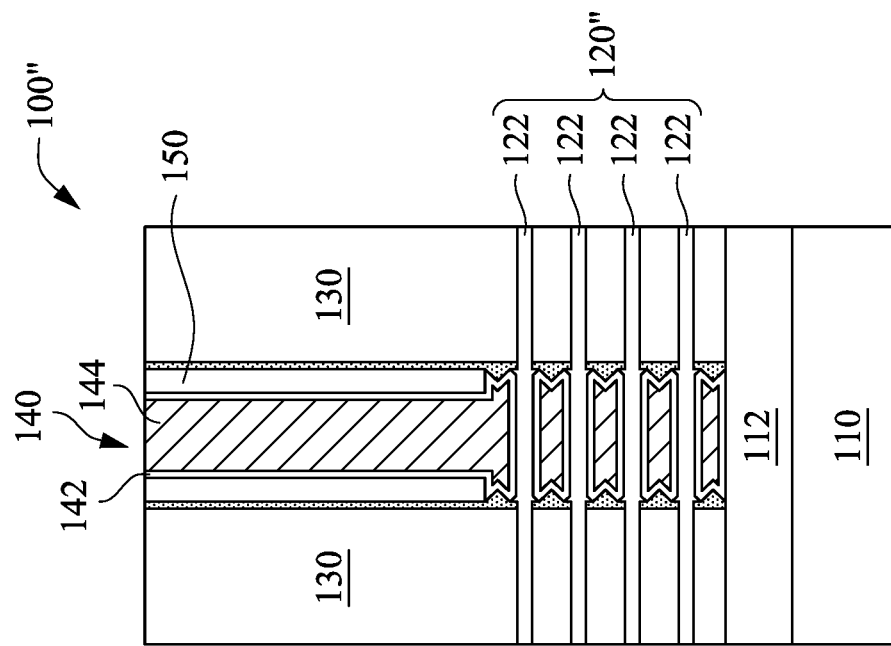
FIGS. 13 and 14 show alternative and/or additional embodiments of example devices according to example embodiments of the disclosure.

FIG. 14 shows another alternative and/or additional structure 100". In the structure 100", the semiconductor strips 122 are not receded to be substantially plumb with the inner spacer 152 and remain extending outward beyond the outer spacer 150 and/or the inner spacer 152. The source/drain regions 130 are formed surrounding, or wrapping around, the semiconductor strips 122.

Other variants are also possible and included in the disclosure. Further, the embodiments and the components thereof may be combined in various ways, which are also included in the disclosure.

The present disclosure may be further appreciated with the description of the following embodiments:

In a device embodiment, a device includes a substrate, a channel region over the substrate, a source/drain structure adjacent to and contacting the channel region and a gate structure surrounds the channel region. The channel region includes a stack of nanowire structures over the substrate. The stack of nanowire structures includes a first nanowire structure that includes a first segment at an edge of the first nanowire structure and a second segment adjacent to the first segment with the second portion having a larger diameter than the first segment. The source/drain structure is adjacent to and contacts the first segment of the first nanowire structure. The gate structure wraps around the first nanowire structure. An inner spacer structure is positioned laterally between the source/drain structure and the gate structure.

In another embodiment, a semiconductor structure includes a substrate, multiple separate semiconductor nanowire strips vertically stacked over the substrate, a semiconductor epitaxy region adjacent to and laterally contacting each of the multiple separate semiconductor nanowire strips, a gate structure at least partially over the multiple separate semiconductor nanowire strips, a first dielectric structure laterally positioned between the semiconductor epitaxy region and the gate structure. The first dielectric structure has a hat-shaped profile.

In further embodiments, a method includes receiving a wafer, the wafer including a stack of epitaxy layers over a substrate, the stack of epitaxy layers including a plurality of semiconductor epitaxy layers and a plurality of sacrificial epitaxy layers stacked in an alternating sequence; forming a fin structure by patterning the wafer, the fin structure including a stack of a plurality of semiconductor strips and a plurality of sacrificial strips; forming a sacrificial gate structure and an outer spacer over the fin structure, the sacrificial gate structure contacting at least three surfaces of the fin structure; forming receded sacrificial strips by selectively removing portions of the plurality of the sacrificial strips that extends laterally beyond the outer spacer and leaving the plurality of the semiconductor strips remain extending laterally beyond the outer spacer; forming an inner spacer laterally adjacent to the receded sacrificial strips; forming exposed edge surfaces of the plurality of the semiconductor strips by receding the plurality of the semiconductor strips; forming a semiconductor layer adjacent to the inner spacer and contacting the exposed edge surfaces of the plurality of the semiconductor strips; forming an open space by removing the sacrificial gate and the receded sacrificial strips; and forming a replacement gate within the open space.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A device, comprising:
a substrate;
a channel region including a stack of nanowire structures over the substrate, the stack of nanowire structures including a first nanowire structure that includes a first segment at an edge of the first nanowire structure and a second segment adjacent to the first segment, the second segment having a larger diameter than the first segment;
a source/drain structure having a linear sidewall extending from an uppermost nanowire structure of the stack of nanowire structures to a bottommost nanowire structure of the stack of nanowire structures, the linear sidewall being adjacent to and contacting the first segment of the first nanowire structure;
a gate structure wrapping around the first nanowire structure; and
an inner spacer structure laterally between the source/drain structure and the gate structure.

2. The device of claim 1, wherein the inner spacer structure is substantially dome-shaped with an apex laterally pointing to the gate structure.

3. The device of claim 1, wherein the inner spacer structure is substantially hat-shaped with a convex top of the hat shape pointing to the gate structure.

4. The device of claim 1, wherein the stack of nanowire structures further includes a second nanowire structure below the first nanowire structure, the second nanowire structure including a first segment and a second segment with the second segment having a larger diameter than the first segment, and the source/drain structure laterally contacting an edge portion of the second nanowire structure.

5. The device of claim 1, wherein the substrate includes a fin structure below the stack of the nanowire structures.

6. The device of claim 1, wherein the gate stack extends above the stack of the nanowire structures, and further comprising an outer spacer laterally adjacent to the gate structure and above the stack of the nanowire structures, and wherein the inner spacer structure extends beyond an outer surface of the outer spacer.

7. The device of claim 6, wherein the outer spacer includes a different dielectric material from that of the inner spacer structure.

8. The device of claim 1, wherein the stack of the nanowire structures are one of one-dimensional silicon or one-dimensional silicon germanium.

9. The device of claim 1, wherein the source/drain structure includes one of one of silicon carbide, silicon carbon phosphide, silicon phosphide, silicon germanium or silicon-germanium-boron.

10. The device of claim 1, wherein the stack of nanowire structures includes a second nanowire structure, wherein a portion of the inner spacer structure is interposed between the second nanowire structure and the source/drain structure.

11. A device, comprising:
a substrate;
a stack of nanowire structures over the substrate, the stack of nanowire structures including a first nanowire structure, the first nanowire structure including a first segment and a second segment adjacent to the first segment, the second segment having a larger diameter than the first segment;
an inner spacer structure contacting one of an upper surface and a lower surface of the first segment immediately adjacent the second segment, the inner spacer having a linear sidewall extending between the first nanowire structure and an adjacent nanowire structure of the stack of nanowire structures;
a source/drain structure adjacent to and contacting the first segment of the first nanowire structure, the source/drain structure contacting an entirety of the linear sidewall of the inner spacer; and
a gate structure wrapping around the second segment of the first nanowire structure.

12. The device of claim 11, wherein the source/drain structure contacts the first segment only on an end surface of the first segment.

13. The device of claim 11, wherein the stack of nanowire structures includes a second nanowire structure, wherein the inner spacer structure is interposed between the second nanowire structure and the source/drain structure.

14. The device of claim 13, wherein the second nanowire structure is above the first nanowire structure.

15. The device of claim 14, wherein the gate stack extends above the stack of the nanowire structures, and further comprising an outer spacer laterally adjacent the gate structure, wherein the outer spacer is above the first segment.

16. The device of claim 15, wherein the inner spacer structure extends along a lateral sidewall of the outer spacer.

17. A device, comprising:
a substrate;
a stack of nanowire structures over the substrate, wherein each of the nanowire structures of the stack of nanowire structures has a first segment having a first width, wherein a first nanowire structure of the stack of nanowire structures has a second segment and a third segment, wherein the first segment of the first nanowire structure is interposed between the second segment and the third segment of the first nanowire structure, wherein a width of the first segment is greater than a width of the second segment and a width of the third segment;

a gate structure wrapping around the first segment of each of the nanowire structures of the stack of nanowires;

an inner spacer structure contacting the second segment of the first nanowire structure; and a source/drain structure adjacent to and contacting the second segment of the first nanowire structure, wherein the source/drain structure has a linear sidewall, wherein the linear sidewall of the source/drain structure contacts the inner spacer structure and the second segment of the first nanowire structure.

18. The device of claim 17, wherein a portion of the inner spacer structure is interposed between the source/drain structure and the first segment of a second nanowire structure of the stack of nanowire structures.

19. The device of claim 17, wherein the source/drain only contacts the first nanowire structure on a lateral end surface of the second segment.

* * * * *